(12) United States Patent
Biber

(10) Patent No.: US 10,794,972 B2
(45) Date of Patent: Oct. 6, 2020

(54) DEVICE AND METHOD FOR AN ASYMMETRICAL BUS INTERFACE FOR A LOCAL COIL

(71) Applicant: Stephan Biber, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 104 days.

(21) Appl. No.: 15/962,771

(22) Filed: Apr. 25, 2018

(65) Prior Publication Data
US 2018/0321341 A1    Nov. 8, 2018

(30) Foreign Application Priority Data
May 5, 2017   (DE) .................. 10 2017 207 631

(51) Int. Cl.
G01R 33/36       (2006.01)
G01R 33/54       (2006.01)
H04L 1/00        (2006.01)

(52) U.S. Cl.
CPC ....... *G01R 33/3692* (2013.01); *G01R 33/543* (2013.01); *H04L 1/0027* (2013.01); *H04L 1/0083* (2013.01)

(58) Field of Classification Search
CPC . G01R 33/3692; G01R 33/543; H04L 1/0027; H04L 1/0083
See application file for complete search history.

(56) References Cited

U.S. PATENT DOCUMENTS

| 5,682,891 A    | 11/1997 | Sonoki |  |
|---|---|---|---|
| 6,294,913 B1 * | 9/2001  | Hinks  | G01R 33/56563 324/309 |
| 6,791,322 B2 * | 9/2004  | Vester | G01R 33/3692 324/309 |
| 6,844,730 B2 * | 1/2005  | Feld   | G01R 33/3621 324/318 |

(Continued)

FOREIGN PATENT DOCUMENTS

| CN | 1116079 A   | 2/1996 |
| CN | 101169472 A | 4/2008 |

(Continued)

OTHER PUBLICATIONS

German Office Action for German Application No. 10 2017 207 631.3 dated Jan. 3, 2018.

(Continued)

*Primary Examiner* — Dixomara Vargas
(74) *Attorney, Agent, or Firm* — Lempia Summerfield Katz LLC

(57) ABSTRACT

The disclosure relates to a local coil as well as a system including a magnetic resonance tomography system with a local coil. The local coil includes a data source and a signal output in signal communication with the data source for outputting data from the data source. The data source is configured to transmit a plurality of data items via the signal output. To this end, the signal output includes a radio-frequency source and a modulator and is configured to modulate to transmit the data from the data source onto a carrier frequency of the radio-frequency source by the modulator.

20 Claims, 2 Drawing Sheets

(56) References Cited

U.S. PATENT DOCUMENTS

| | | | | |
|---|---|---|---|---|
| 7,469,838 B2* | 12/2008 | Brooks | G01R 33/02 | 235/449 |
| 9,733,322 B2* | 8/2017 | Hardie | G01R 33/3692 | |
| 10,088,594 B2* | 10/2018 | Paulsen | G01V 3/32 | |
| 2002/0087063 A1* | 7/2002 | Lou | G01R 33/3621 | 600/410 |
| 2002/0149498 A1* | 10/2002 | Tabanou | E21B 47/13 | 340/854.5 |
| 2002/0171560 A1* | 11/2002 | Ciglenec | E21B 29/06 | 340/853.1 |
| 2002/0195247 A1* | 12/2002 | Ciglenec | E21B 47/12 | 166/250.11 |
| 2003/0020473 A1* | 1/2003 | Speier | G01V 3/32 | 324/303 |
| 2003/0058125 A1* | 3/2003 | Ciglenec | E21B 49/10 | 340/853.1 |
| 2003/0076105 A1* | 4/2003 | Feld | G01R 33/3621 | 324/322 |
| 2003/0078004 A1* | 4/2003 | Vester | G01R 33/3692 | 455/42 |
| 2005/0033544 A1* | 2/2005 | Brooks | G01V 15/00 | 702/128 |
| 2008/0100297 A1 | 5/2008 | Ishii | | |
| 2009/0230966 A1* | 9/2009 | Ehnholm | G01R 33/3415 | 324/322 |
| 2010/0302060 A1* | 12/2010 | Montgomery | G01V 1/26 | 340/853.7 |
| 2012/0249140 A1* | 10/2012 | Albsmeier | G01R 33/3692 | 324/309 |
| 2013/0106419 A1 | 5/2013 | Biber | | |
| 2013/0154844 A1* | 6/2013 | Montgomery | G01V 3/18 | 340/853.1 |
| 2013/0225980 A1 | 8/2013 | Biber | | |
| 2014/0361769 A1* | 12/2014 | Hardie | G01R 33/3692 | 324/307 |
| 2015/0293197 A1 | 10/2015 | Taniguchi | | |
| 2016/0109613 A1* | 4/2016 | Paulsen | G01V 3/32 | 324/303 |
| 2017/0212193 A1 | 7/2017 | Song | | |
| 2017/0248665 A1 | 8/2017 | Ludwig et al. | | |

FOREIGN PATENT DOCUMENTS

| | | |
|---|---|---|
| CN | 102736042 A | 10/2012 |
| CN | 202661619 U | 1/2013 |
| CN | 103293496 A | 9/2013 |
| CN | 104730478 A | 6/2015 |
| CN | 104977550 A | 10/2015 |
| CN | 105445682 A | 3/2016 |
| DE | 102011017800 B3 | 8/2012 |
| DE | 102016203255 A1 | 8/2017 |
| DE | 102017202399 A1 | 8/2018 |

OTHER PUBLICATIONS

Chinese Office Action for Chinese Application No. 201810419810.9 dated Mar. 12, 2020, with English translation.

* cited by examiner

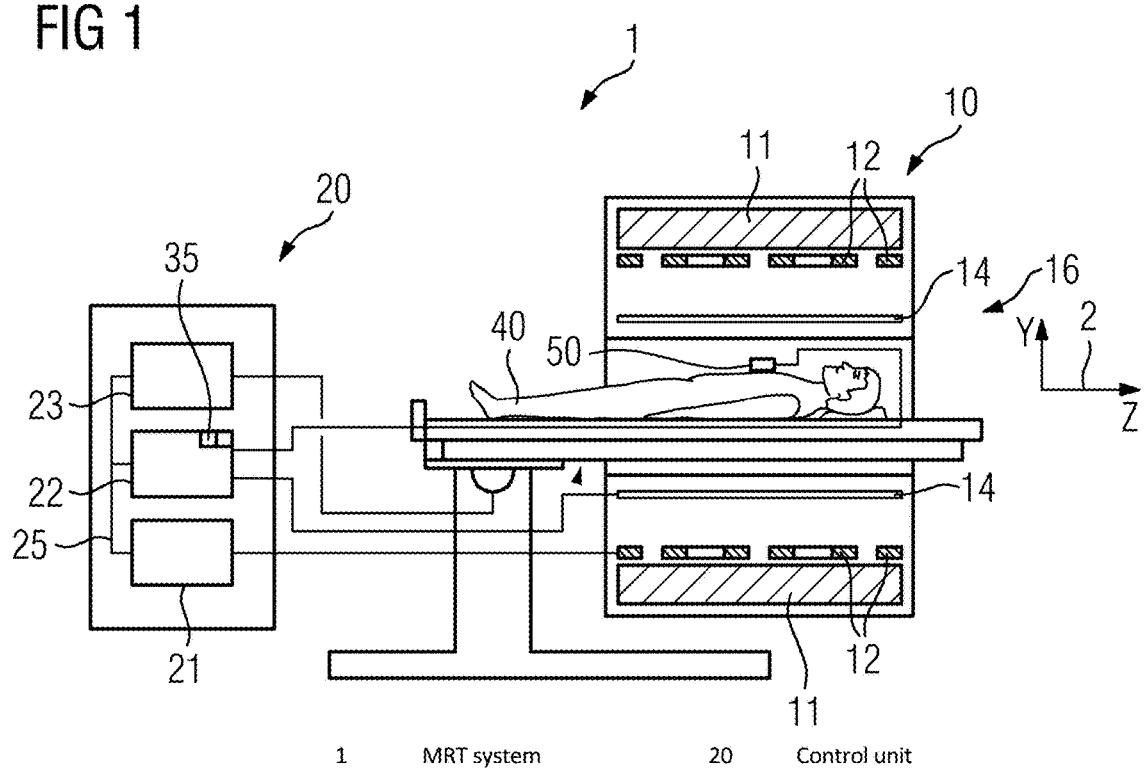
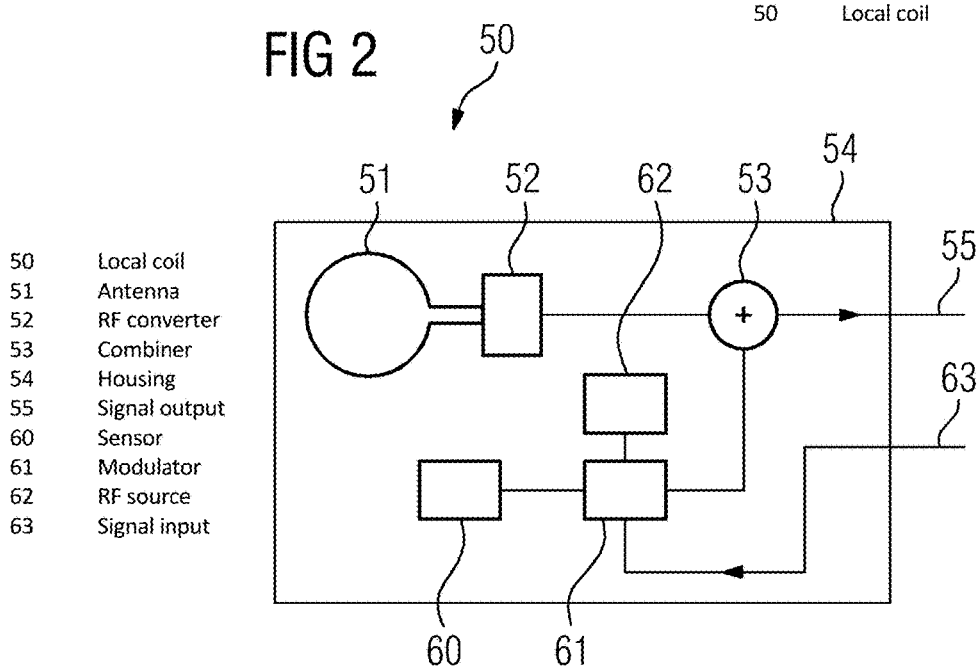

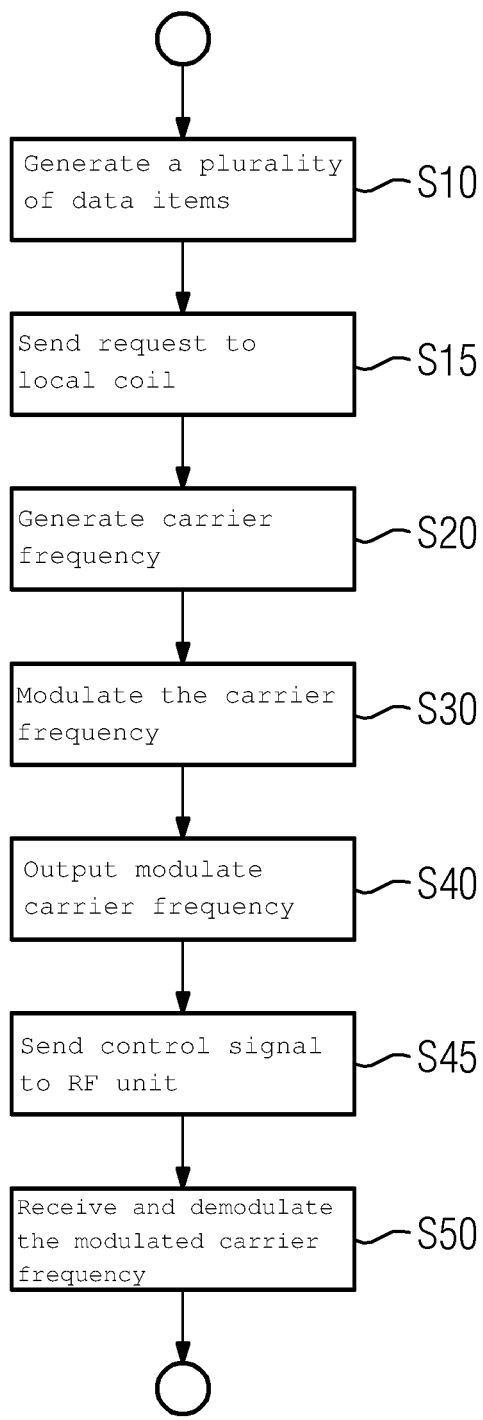

DEVICE AND METHOD FOR AN ASYMMETRICAL BUS INTERFACE FOR A LOCAL COIL

The application claims the benefit of German Patent Application No. DE 10 2017 207 631.3, filed May 5, 2017, which is hereby incorporated by reference in its entirety.

TECHNICAL FIELD

The disclosure relates to a local coil as well as a system including a local coil and a magnetic resonance tomography system, and also a method for operation. The local coil includes a data source and a data bus in signal communication with the data source for requesting data from the data source. The data bus includes a signal output, wherein the data source is configured to transmit a plurality of data items via the signal output.

BACKGROUND

Magnetic resonance tomography (MRT) systems are imaging devices that, in order to image an object under examination, align nuclear spins of the object under examination with a strong external magnetic field and excite them by a magnetic alternating field to precess about this alignment. The precession or return of the spins from this excited state to a state with a lower energy in turn generates an alternating magnetic state as a response that is received via antennas.

With the aid of magnetic gradient fields, a position encoding that subsequently enables an association of the received signal with a volume element is imparted to the signals. The received signal is then evaluated and a three-dimensional imaging display of the object under examination is provided. To receive the signal, local antennas (so-called local coils) may be used, which, to achieve a better signal/noise ratio, are arranged directly on the object under examination.

However, in addition to the magnetic resonance (MR) signals, further signals relevant for the image acquisition or safety may be generated from various sensors in the local coil. However, control buses used to date, such as $I_2C$, are not sufficient for real-time transmission of data quantities of this kind.

Post-published documents DE 10 2017 202 399 and DE 10 2016 203 255, for example, describe magnetic field sensors for identifying location and/or position.

SUMMARY AND DESCRIPTION

Therefore, the object is to provide a local coil and an MRI system that enable the transmission of additional data.

The scope of the present disclosure is defined solely by the appended claims and is not affected to any degree by the statements within this description. The present embodiments may obviate one or more of the drawbacks or limitations in the related art.

The local coil includes a data source and a signal output in signal communication with the data source for outputting data from the data source. Herein, signal output designates a data connection with a direction of transmission away from the local coil, e.g., toward a magnetic resonance tomography system. The data source may include sensors that detect ambient conditions of the local coil required for imaging or a patient's safety. Herein, sensors for detecting SAR exposure or temperature of the local coil are also conceivable. The data source may output the data in digital form, but signals in analog form would also be conceivable. Also possible are several data sources of the same or different type that are jointly in signal communication with the signal output and transmit data thereby.

The data source is configured to transmit a plurality of data items via the signal output. For the purposes of the disclosure, a plurality of data items relates to a predetermined time period so that the data generated by the data source may be transmitted in real time. For example, the signal output may be configured to transmit more than 1 Mbit/s, 5 Mbit/s, or 10 Mbit/s.

The signal output includes a radio-frequency source. Herein, this may be an oscillator, which may generate a free-oscillating precisely determined frequency or is configured for synchronization with an external reference clock of a magnetic resonance tomography system. Herein, the frequency may be in the range of the frequency of the magnetic resonance signals to be transmitted from the local coil to the magnetic resonance tomography system so that it may be conditioned in a radio-frequency unit in a common receiver. This may be the Larmor frequency of the magnetic resonance tomography system or an intermediate frequency generated for transmission.

The signal output furthermore includes a modulator. The signal output is configured to modulate the data from the data source onto a carrier frequency from the radio-frequency source by the modulator. In the case of analog data signals, amplitude, or frequency or phase modulation is conceivable, for example. In the case of digital signals, it may be possible to use frequency-shift keying (FSK), phase-shift keying (PSK), quadrature phase-shift keying (QPSK), or quadrature amplitude modulation (QAM). Also conceivable are spread spectrum modulation methods, which enable transmission of the data in the same frequency range as the MR signals without disrupting them if the level remains below the noise limit of the MR signal. One possible example of a spread spectrum modulation is code division multiple access (CDMA), but also conceivable are, for example, direct sequence spread spectrum (DSSS), frequency hopping spread spectrum (FHSS), or chirp spread spectrum (CSS). Otherwise, time-division multiplexing is possible in that transmission of data takes place in the signal output when no MR signals are expected. For example, in an embodiment, transmission of a data-modulated carrier wave from the radio-frequency source and a magnetic resonance signal in a common signal line is possible.

Advantageously, in addition to the MR signals, the local coil enables further data relevant for safety or imaging to be transmitted in real time without providing additional signal lines between the local coil and the magnetic resonance tomography system.

The system including the local coil and a magnetic resonance tomography system, and the method share the advantages of the local coil.

In one conceivable embodiment of the local coil, the data source has a magnetic field sensor for detecting a static magnetic field BO. The magnetic field sensor may have one or more Hall sensors arranged in different spatial directions so that the sensor is also possible to detect the direction of the BO field. However, also conceivable are other magnetic field sensors based, for example, on induction or other principles.

Advantageously, detection of the static magnetic field enables the determination of a location of the local coil with respect to a field magnet and hence with respect to the magnetic resonance tomography system if the properties of the static magnetic field are known.

In one possible embodiment, the data source is configured to combine a plurality of data items to form a data packet with a frame and to transmit the frame via the signal output by the modulator. For example, the data source may combine a plurality of data items from a plurality of sensors or sequential values from one sensor in a frame. Herein, a frame may refer to a data structure with an identifiable start and a predetermined structure that enables the individual data items in a frame to be identified again and separated at a receiving opposite side. This may be achieved by using certain unique bit patterns for the frame markers and bit scramblers for the payload.

Advantageously, the use of frames enables asynchronous transmission of data so that it not necessary to know the precise time of the start of the data transmission for faultless reception.

In one conceivable embodiment of the local coil, the local coil includes a signal input for transmitting data to the local coil with signal communication to the data source. Herein, signal input designates a data connection with a direction of transmission toward the local coil, e.g., from a magnetic resonance tomography system. The signal output is configured for a much higher data transmission rate than the signal input. For example, the signal input may be configured for a data rate of less than 1 Mbit/s, 100 kBit/s, or below while the signal output is more than 1 Mbit/s, 5 Mbit/s, or above. The data source is configured, on a request via the signal input, to transmit a plurality of data items via the signal output. Herein, it is also conceivable for the local coil to be configured without transmission not to generate a carrier wave or output it to the signal line.

The signal input advantageously enables the time of transmission of data from the local coil to be controlled from a magnetic resonance tomography system. For example, it is possible to prevent the data transmission taking place simultaneously with a MR signal and a fault occurring. However, it is also conceivable for the request via the signal input to synchronize the transmission so that, after a predetermined time after the request, the data is sent from local coil and thus evaluation of the data is simplified in that there is no need for permanent reception and/or for the start of the data to be identified.

In one possible embodiment of the system, the receiver is configured to digitize a received signal and, in dependence on a control signal, to demodulate certain time sections of the received signal.

Advantageously, the magnetic resonance tomography system may influence the demodulation of the data by the control signal so that signal processing resources are not unnecessarily blocked.

In one conceivable embodiment of the system, the magnetic resonance tomography system is configured to send a request to the local coil via the signal input and, in a predetermined time relative to the request, to send the control signal to the receiver so that the receiver demodulates a first section. Herein, the predetermined time relative to the request may indicate a delay between the sending of the request and reception, (e.g., due to signal propagation times), time for the collection of data for a frame or propagation times of program components for processing in the local coil.

It is conceivable that, after a request, data from the data source has to be received and evaluated, while at another time an MR signal is received. This advantageously enables a signal processing resource to perform demodulation, on the one hand, and filtering or another type of signal processing at another time.

In one possible embodiment of the system, the receiver is configured to demodulate data from the data source over a plurality of time sections of adjoining time sections. For example, it is conceivable for a memory to be provided to buffer the data beyond the limits of a time section.

Advantageously, demodulation extending over a plurality of time sections also enables longer sequences of data to be received continuously.

In one conceivable embodiment of the system, the demodulator includes a correlator configured to identify the start of the frame in the received signal and to demodulate the data packet. For example, it is conceivable for there to be a unique bit sequence for frame identification, while the data in the frame is scrambled, so that the correlator may uniquely identify the frame identification word.

Advantageously, the correlator enables the start of a data transmission to be identified. Thus, it is not necessary for the data transmission to be synchronized or performed permanently.

In one possible embodiment of the system, the magnetic resonance tomography system includes a decimator configured to reduce the plurality of received data items. For example, it is conceivable that changes in the data are identified and only these changes are forwarded.

Advantageously, a decimator reduces the bandwidth and processing capacity required in the subsequent acts.

BRIEF DESCRIPTION OF THE DRAWINGS

The above-described properties, features, and advantages of the disclosure and also the manner in which these are achieved will become clearer and more comprehensible in conjunction with the following description of the exemplary embodiments, explained in more detail in conjunction with the drawings, in which:

FIG. 1 depicts an exemplary schematic representation of a magnetic resonance tomography system with a local coil.

FIG. 2 depicts a schematic representation of an embodiment of a local coil.

FIG. 3 depicts a schematic flow diagram for an exemplary method for transmitting data from a data source in a local coil.

DETAILED DESCRIPTION

FIG. 1 depicts a schematic representation of an embodiment of a magnetic resonance tomography system 1 with a local coil 50.

The magnet unit 10 includes a field magnet 11 that generates a static magnetic field BO for the alignment of nuclear spins in specimens or patients 40 in a receiving region. The receiving region is arranged in a patient tunnel 16 extending in a longitudinal direction 2 through the magnet unit 10. The field magnet 11 may be a superconducting magnet that is able to provide magnetic fields with a magnetic flow density of up to 3T, or even more with the most recent devices. However, it is also possible to use permanent magnets or electromagnets with normally conducting coils for lower field strengths.

Furthermore, the magnet unit 10 includes gradient coils 12 configured for the spatial differentiation of the acquired imaging regions in the examination volume, to superimpose the magnetic field BO with variable magnetic fields in three spatial directions. The gradient coils 12 may be coils made of normally conducting wires able to generate fields that are orthogonal to one another in the examination volume.

The magnet unit 10 also includes a body coil 14 configured to emit a radio-frequency signal supplied via a signal line into the examination volume and to receive resonance signals emitted by the patient 40 positioned on a patient table 30 and transmit the resonance signals out via a signal line 36. However, for the emission of the radio-frequency signal and/or the reception, the body coil 14 may be replaced by local coils 50 arranged in the patient tunnel 16 close to the patient 40. However, it is also conceivable for the local coil 50 to be configured for transmission and reception and therefore for a body coil 14 to be dispensed with.

A control unit 20 supplies the magnet unit 10 with the different signals for the gradient coils 12 and the body coil 14 and evaluates the received signals.

Thus, the control unit 20 includes a gradient activation system 21 configured to supply the gradient coils 12 via leads with variable currents that provide the desired gradient fields in the examination volume in temporal coordination.

Furthermore, the control unit 20 includes a radio-frequency unit 22 configured to a generate a radio-frequency pulse with a prespecified temporal course, amplitude, and spectral power distribution to excite a magnetic resonance of the nuclear spins in the patient 40. Herein, it is possible to achieve pulse powers in the kilowatt range.

FIG. 2 depicts an exemplary embodiment of the local coil 50.

An antenna 51, which may take the form of an antenna coil, is arranged in a housing 54. The antenna coil is configured to receive a magnetic resonance signal from a patient 16 in a magnetic resonance tomography system 1.

The received MR signal is further processed by an RF converter 52 of the local coil 50 and conditioned for transmission. The RF converter 52 may include a pre-amplifier that performs impedance matching of the antenna coil and amplifies the MR signal. Also conceivable are filters for the suppression of faults and/or an oscillator and mixer to convert the MR signal for transmission on another frequency. It would also be possible for the MR signal to be digitized by an A/D converter before transmission.

Furthermore, the local coil 50 includes a sensor 60 that receives measured values from the local coil 50 or the environment thereof. Also conceivable, for example, would be a magnetic field sensor that supplies information on a spatial location of the local coil 50 to the field magnet 11 with reference to a continuously acquired static magnetic field BO at the site of the local coil. However, also possible would be temperature sensors or field strength sensors that monitor observance of the SAR limit values and thus permanently provide the safety of the patient 16. The conceivable sensors 60 have the common feature that the measured values have to be acquired and forwarded frequently and virtually in real time.

In order to transmit the measured values, they are conditioned in a modulator 61 for transmission via a signal output 55 via which transmission takes place jointly with the conditioned MR signals.

Herein it is conceivable for the measured values to be radio-frequency modulated using an analog method. For example, a radio-frequency source 62 may supply a carrier frequency which is then modulated with the signal of the sensor 60 by frequency modulation or another modulation method. However, it is also conceivable for the signal from the sensor 60 to be first digitized in the modulator and only then modulated onto the carrier frequency. This in particular facilitates multiplexing of signals from a plurality of sensors 60 so that they may be transmitted virtually simultaneously.

In a combiner 53, the signal of the modulator 61 and the signal of the RF converter 52 are combined to form one single signal, which is output via the signal output 55. When operated as intended, the signal output 55 is in signal communication 33 with the radio-frequency unit 22 of the magnetic resonance tomography system 1. It is, for example, conceivable, to use coaxial cables, symmetrical connecting lines or even optical fibers. However, it would also be possible to use a wireless connection, for example, via WLAN, Bluetooth, or even a proprietary transmission method.

In an embodiment, the radio frequency of the radio-frequency source 62 and the signals output by the RF converter 52 have almost the same frequencies so that, at an opposite side in the magnetic resonance tomography system, the radio-frequency unit 22 may evaluate the transmitted signals from the sensor 60 and the received MR signals with a common receiver 35 for both signals. This may relate to the Larmor frequency or also an intermediate frequency used for transmission.

Herein, it is on the one hand conceivable for signals from the sensor 60 and MR signals to be transmitted in alternation. For example, data from the sensor 60 may be transmitted during the excitation pulses during which no MR signals may be received. However, it is also conceivable for the carrier frequency of the modulator to be present in addition to the Larmor frequency or the carrier or intermediate frequency used for transmission of the MR signals so that both signals are still present in a reception range of the radio-frequency unit 22 and may be received simultaneously.

Finally, it is possible, for the transmission of the signals of the sensor 60 to use modulation methods that distribute the information in the signals over a broad spectrum. One possible example of spread spectrum modulation is code division multiple access (CDMA), but also conceivable are, for example, direct sequence spread spectrum (DSSS), frequency hopping spread spectrum (FHSS), or chirp spread spectrum (CSS). Herein, the level of signals modulated in this way may remain below the noise level of the MR signals so that simultaneous transmission of data from the sensor 60 and MR signals is possible without any deterioration of the imaging signals.

If the MR signals are already digitized in the local coil, it is ultimately also possible for digital multiplexing of MR signals and signals of the sensor 60 to take place before transmission.

Herein, the radio-frequency unit 22 includes a receiver 35 capable of demodulating the signals transmitted from the local coil 50 via the data output 55 and to extract the data from the data source.

Herein, this may entail a digital receiver 35 that digitizes the signal received from the signal output 55. This permits flexible adaptation to different transmission methods, for example, if it is necessary to transmit large amounts of data in real time. In one embodiment, the receiver 35 is configured to demodulate certain time sections of the received signal in dependence on a control signal. For example, the control 23 may instruct the radio-frequency unit 22 via the signal bus 25 to demodulate and extract from the signal received from the signal output 55 the data from magnetic field sensors 60 located in a relevant region of the magnetic field BO and thus, for example, enabling as precise a localization as possible.

In one possible embodiment of the local coil, the data source, (e.g., the magnetic field sensor 60), supplies data in real time. Herein it is advantageous for a plurality of data elements to be packed in frames, e.g., a superstructure. The superstructure enables the identification of the start of a packet of data elements in a data stream, and also of further individual elements therein. It is therefore not necessary for transmission to take place synchronously with a clock or with a precisely defined time interval from a request for data by the magnetic resonance tomography system 1. Therefore, variable delays are permissible. Frames may be provided in that certain reserved bit patterns are reserved for the frame structure (e.g., headers) and the data elements are scrambled, e.g., processed with reversible mapping such that the reserved bit patterns do not appear in the payload. Herein, the bit patterns may also provide information on the bit clock used. The data may then be transmitted via the signal output 55 without necessitating synchronization with a clock or a requirement. In addition, the frame also enables the reduction of additional information required for the individual transmission of the data elements.

In one conceivable embodiment of the local coil, the local coil includes a signal input 63 for transmitting data to the local coil with signal communication to the data source. For example, it is possible for information with which transmission of measured values via the signal output 55 is triggered to be sent to the sensor 60 or the modulator 61 via the signal input 63. The signal input 63 used may be an I$_2$C-Bus, Ethernet, USB, or also other interface. It is, in particular, not necessary for the signal input 63 to provide a transmission rate comparable to the signal input 55 because only a few setting commands have to be transmitted via this data input 63. Here, once again, wireless transmission methods are conceivable.

Herein it is conceivable, in one possible embodiment, for the control 23 to send a request to the data source for the transmission of data via the signal input 63 and a command for the demodulation of the data input from the signal output 55 via a control signal to the radio-frequency unit 22. Herein, the control 23 may achieve synchronization by a predetermined time interval between the request and the command so that only certain items of data are demodulated, which may be assigned to a specific sensor or a specific measuring time. This may reduce the computing load in the receiver 35 for the demodulation. Depending upon the control signal, it is also possible for the signal received from the signal output to be digitized, thus enabling the avoidance of unwanted interference signals or reduction of the energy consumption of the radio-frequency unit 22.

However, it is also possible, in one conceivable embodiment, for the receiver 35 to output data sent from the data source continuously or demodulated in blocks. This makes further processing more flexible at the receiving side and enables access to all data. Herein, it is, for example, conceivable for a decimator to be provided in the radio-frequency unit 22 directly after the demodulation or in a subsequent processing unit to reduce the data quantity from the demodulator for the further processing. It would be conceivable for data with a certain rate to be rejected, made dependent upon the respective data source or rejected in dependence on predetermined criteria. It is, for example, conceivable for only data with a changed content to be forwarded. However, in principle, corresponding data filtering in the data source or the modulator 61 of a local coil 50 would also be possible.

In one possible embodiment of the system including a local coil 50 and a magnetic resonance tomography system 1, the demodulator includes a correlator. The correlator is configured to identify the reserved bit pattern in a received bit sequence and in this way to identify the start of a frame with data from the data source. In the case of a bit sequence reserved exclusively for the frame (by scrambling the payload), it is conceivable for the correlator to be a simple comparator that identifies the frame start by comparing the incoming bit sequence with the reserved bit sequence. The demodulator may then demodulate and separate the individual data items from different data sources in the frame or data acquired at different times.

Herein, it is also conceivable for the demodulator to be furthermore configured to collect or sort data so that, for example, measured values from an individual data source are available over a plurality of frames as a data sequence for further processing.

FIG. 3 depicts a schematic flow diagram for an exemplary method for transmitting data from a data source in a local coil. The method is used in the local coil or the system described herein.

In act S10, a plurality of data items is generated by the data source. The data items may be generated by sampling output values from the sensor 60, for example a magnetic field sensor or a breathing sensor. Sampling may be performed in real time, e.g., at a characteristic rate for the environmental signal detected by the sensor. For a magnetic field sensor for detecting movements of the local coil or patient bench, sampling rates of between 1 Hz and 10 Hz are sufficient for this; similar rates are sufficient for breathing movements. However, a higher rate, for example from 5 Hz to 50 Hz, may be advisable for a pulse sensor.

In act S20, a carrier frequency is generated by the radio-frequency source 62. Because the signal is subsequently transmitted on common paths with the magnetic resonance signal and is to be evaluated by common units, the carrier frequency is transmitted either in the range of or close to a frequency which is also able to transmit the received magnetic resonance signals. This may be either the Larmor frequency of the magnetic resonance tomography system 1 or also an intermediate frequency used for transmission. Herein, 'near to' may refer to a maximum frequency deviation of 1%, 5%, or 10% in the frequency used for the transmission of the magnetic resonance signals.

In act S30, the carrier frequency is modulated with the data by the modulator 61. Corresponding modulating methods were described above in connection with the modulator 61.

In act S40, the modulated carrier frequency is output to the signal output 55. Herein, the signal output 55 may be a common signal output from the local coil 50 for the modulated carrier wave and the magnetic resonance signal or signals. Therefore, in principle, separate transmission paths are conceivable so that in the following a dedicated receiver 35 of the radio-frequency unit 22 is used for the demodulation. This may be a receiver 35 that may also be used for the magnetic resonance signals and so no special hardware is required.

In act S50, the receiver 35 receives and demodulates the modulated carrier frequency. Herein, demodulation includes both the recovery of the carrier frequency on the modulation of an imparted low-frequency signal and the recovery of the data from the data source, for example by removing redundancies and additional error control data, for example checksums and data frames. This is performed using complementary methods to the modulation methods described with reference to the modulator 61. The same receiver 35 may be used in alternation or even simultaneously with the reception of an MR signal.

In one conceivable embodiment of the method, the local coil includes a signal input. In act S15, the control 23 sends a request from the magnetic resonance tomography system to the local coil 50 via the signal input. For example, it is conceivable for the control 23 to be in signal communication with the local coil 50 via a I$_2$C bus and to transfer a command for reading out the sensor 60 via this bus.

In act S45, the control 23 sends, at a predetermined time relative to the request, a control signal to the radio-frequency unit 22. This, for example, makes it possible for a receiver 35 in the radio-frequency unit 22 only to be activated or in changed to special mode when a signal is to be expected from the sensor 60 with a predetermined delay. In this way, it is also conceivable for a digital receiver 35 with limited storage capacity for the digitized radio frequency to buffer the signal with the modulated data from the sensor 60 thus reducing the requirements for signal processing capacity.

In act S50, the radio-frequency unit 22 demodulates the carrier frequency in the predetermined time section. Herein, the predetermined time section may correspond to the time section described with reference to act 45, the section of the radio-frequency signal buffered in a memory of the receiver 35. However, it is also equally conceivable for the demodulation to take place in real time and the time section only to correspond to a data frame with a predetermined number of data items from the sensor 60. For example, the receiver 35 may be used in the interim to process other signals. The request and the control signal also enable, in a predetermined temporal sequence, assignment of the received data to the time of the request or a time which is dependent thereon and predetermined.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil comprising:
   at least one sensor arranged within a housing of the local coil, wherein the at least one sensor is configured to detect data of a magnetic resonance tomography system;
   an oscillator arranged within the housing of the local coil;
   a modulator arranged within the housing of the local coil, wherein the modulator is configured to modulate the data from the at least one sensor onto a carrier frequency of the oscillator to provide a modulated carrier frequency; and
   a signal output in signal communication with the at least one sensor for outputting the modulated data,
   wherein the at least one sensor is configured to transmit a plurality of data items generated from the data via the signal output to a control unit of the magnetic resonance tomography system.

2. The local coil of claim 1, wherein the local coil is configured to transmit the modulated carrier frequency in a common signal line with a magnetic resonance signal.

3. The local coil of claim 2, wherein the at least one sensor comprises a magnetic field sensor for detecting a static magnetic field of the magnetic resonance tomography system.

4. The local coil of claim 3, wherein the at least one sensor is configured to a combine the plurality of data items to form a data packet with a frame and to transmit the frame via the signal output by the modulator.

5. The local coil of claim 4, further comprising:
   a signal input configured to transmit data of the magnetic resonance tomography system to the local coil with signal communication to the at least one sensor,
   wherein the signal output is configured for a higher data transmission rate than the signal input and the at least one sensor is configured, on a request via the signal input, to transmit the plurality of data items via the signal output.

6. The local coil of claim 1, wherein the at least one sensor comprises a magnetic field sensor for detecting a static magnetic field of the magnetic resonance tomography system.

7. The local coil of claim 1, wherein the at least one sensor is configured to a combine the plurality of data items to form a data packet with a frame and to transmit the frame via the signal output by the modulator.

8. The local coil of claim 1, further comprising:
   a signal input configured to transmit data of the magnetic resonance tomography system to the local coil with signal communication to the at least one sensor,
   wherein the signal output is configured for a higher data transmission rate than the signal input and the at least one sensor is configured, on a request via the signal input, to transmit the plurality of data items via the signal output.

9. A system comprising:
   a local coil comprising:
   at least one sensor arranged within a housing of the local coil, wherein the at least one sensor is configured to detect data of a magnetic resonance tomography system;
   an oscillator arranged within the housing of the local coil;
   a modulator arranged within the housing of the local coil, wherein the modulator is configured to modulate the data from the at least one sensor onto a carrier frequency of the oscillator to provide a modulated carrier frequency; and
   a signal output in signal communication with the at least one sensor for outputting the modulated data,
   wherein the at least one sensor is configured to transmit a plurality of data items generated from the data via the signal output; and
   a magnetic resonance tomography system comprising a receiver for receiving a magnetic resonance signal from the local coil,
   wherein the local coil is configured to be connected to the magnetic resonance tomography system via a signal line, and
   wherein the receiver is configured to receive the carrier frequency of the oscillator of the local coil and comprises a demodulator configured to demodulate the modulated data from the at least one sensor.

10. The system of claim 9, wherein the receiver of the magnetic resonance tomography system is configured to digitize the received magnetic resonance signal and, in dependence on a control signal, to demodulate certain time sections of the received magnetic resonance signal.

11. The system of claim 10, wherein the local coil comprises a signal input configured to transmit data to the local coil with signal communication to the at least one sensor, wherein the magnetic resonance tomography system is configured to send a request to the local coil via the signal input and, in a predetermined time relative to the request, to send the control signal to the receiver so that the receiver demodulates a first section.

12. The system of claim 11, wherein the magnetic resonance tomography system comprises a decimator configured to reduce the plurality of data items.

13. The system of claim 10, wherein the receiver is configured to demodulate the modulated data via plurality of time sections of adjoining time sections.

14. The system of claim 9, wherein the at least one sensor is configured to a combine the plurality of data items to form a data packet with a frame and to transmit the frame via the signal output by the modulator, and wherein the demodulator comprises a correlator configured to identify a start of the frame in the received signal and to demodulate the data packet.

15. A method for transmitting data from at least one sensor in a local coil to a magnetic resonance tomography system, wherein the local coil comprises the at least one sensor, an oscillator, a modulator, and a signal output, the method comprising:

generating a plurality of data items by detection of data of the magnetic resonance tomography system by the at least one sensor arranged within a housing of the local coil;

generating a carrier frequency by the oscillator arranged within the housing of the local coil;

modulating the carrier frequency with the data by the modulator arranged within the housing of the local coil; and outputting, via the signal output, the modulated carrier frequency to a control unit of the magnetic resonance tomography system.

16. The method of claim 15, further comprising:

receiving, by a receiver of the magnetic resonance tomography system, magnetic resonance signals from the signal output of the local coil; and demodulating, by the receiver, the modulated carrier frequency.

17. The method of claim 16, further comprising:

sending a request from the magnetic resonance tomography system to the local coil via a signal input of the local coil;

sending a control signal to the receiver at a predetermined time relative to the request; and demodulating the carrier frequency in a predetermined time section.

18. The method of claim 15, further comprising:

sending a request from the magnetic resonance tomography system to the local coil via a signal input of the local coil;

sending a control signal to a receiver of the magnetic resonance tomography system at a predetermined time relative to the request; and demodulating the carrier frequency in a predetermined time section.

19. The local coil of claim 1, wherein the data is an ambient condition of the local coil, a specific absorption rate (SAR) exposure, a temperature of the local coil, a spatial location of the local coil, or a combination thereof.

20. The system of claim 9, wherein the data is an ambient condition of the local coil, a specific absorption rate (SAR) exposure, a temperature of the local coil, a spatial location of the local coil, or a combination thereof.

\* \* \* \* \*